United States Patent
Watanabe (10) Patent No.: US 6,674,095 B1
(45) Date of Patent: Jan. 6, 2004

(54) COMPOUND SEMICONDUCTOR SURFACE STABILIZING METHOD, SEMICONDUCTOR LASER DEVICE FABRICATING METHOD USING THE STABILIZING METHOD, AND SEMICONDUCTOR DEVICE

(75) Inventor: Masanori Watanabe, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 276 days.

(21) Appl. No.: 09/584,380

(22) Filed: May 31, 2000

(30) Foreign Application Priority Data

May 31, 1999 (JP) .......................... 11-151259
Mar. 30, 2000 (JP) ....................... 2000-094340

(51) Int. Cl.⁷ .......................................... H01L 29/227
(52) U.S. Cl. ............................ 257/98; 438/38; 438/31; 438/46; 257/91
(58) Field of Search .......................... 438/38, 29, 31, 438/46; 257/91, 98, 103, 184, 183.1; 372/43, 49

(56) References Cited

U.S. PATENT DOCUMENTS

| | | | |
|---|---|---|---|
| 4,513,057 A | 4/1985 | Peters | |
| 5,366,934 A | 11/1994 | La Chapelle, Jr. | |
| 5,474,939 A | * 12/1995 | Pollock et al. | ................ 438/38 |
| 5,799,028 A | 8/1998 | Geels et al. | |
| 6,197,667 B1 | * 3/2001 | Chang et al. | ................ 438/570 |
| 6,228,672 B1 | * 5/2001 | Ashby | .......................... 438/38 |

FOREIGN PATENT DOCUMENTS

| | | |
|---|---|---|
| JP | A-3149889 | 6/1991 |
| JP | A-4345079 | 12/1992 |
| JP | A-7176819 | 7/1995 |
| JP | A-9121076 | 5/1997 |

OTHER PUBLICATIONS

C.J. Sandroff et al. "Dramatic enhancement in the gain of GaAs/AlGaAs heterostructure bipolar transistor by surface chemical passivation" Applied Physics Letters vol. 51, No. 1, pp. 33–35 (Jul. 6, 1987).*
Patent Abstracts of Japan, vol. 015, No. 375 (E–1114), Sep. 20, 1991.
Patent Abstracts of Japan, vol. 1995, No. 10, Nov. 30, 1995.

* cited by examiner

Primary Examiner—Caridad Everhart
(74) Attorney, Agent, or Firm—Birch, Stewart, Kolasch & Birch, LLP (57) ABSTRACT

In a compound semiconductor surface stabilizing method, a compound semiconductor is immersed in a solution containing sulfur ions, and then, the compound semiconductor is immersed in a solution containing cations, which react with sulfur to form a sulfide. These immersing steps form a sulfur layer and a sulfide layer in this order on a surface of the compound semiconductor.

21 Claims, 4 Drawing Sheets

COMPOUND SEMICONDUCTOR SURFACE STABILIZING METHOD, SEMICONDUCTOR LASER DEVICE FABRICATING METHOD USING THE STABILIZING METHOD, AND SEMICONDUCTOR DEVICE

BACKGROUND OF THE INVENTION

The present invention relates to the stabilization of surfaces of a compound semiconductor to be used for a semiconductor device and, in particular, to a fabrication technique appropriate to prevent the deterioration of the light-emitting end surface of a semiconductor laser device.

In recent years, semiconductor laser devices have been broadly used as key components for optical disks and optical communications.

In a typical conventional semiconductor laser device, a reflecting film (typically, a dielectric film) for regulating the reflectance is formed at a light-emitting portion, and this film has been used for protecting the light-emitting portion and controlling the reflectance. For this film, $Al_2O_3$ (alumina), SiOx (silicon oxide), and SiNx (silicon nitride) have been typically used. Also, a process such as electron beam evaporation (EB evaporation), plasma CVD, ECR-CVD, or sputtering has been typically used to form the reflecting film.

A semiconductor interface state is generated at the light-emitting end surface formed by the aforementioned conventional process. In addition to this, a very intense light passes through this end surface. This has led to the problem that the light-emitting end surface tends to deteriorate, particularly during a high-power operation.

As a solution to this problem, there has been a method in which a bar obtained by cleaving a semiconductor laser device wafer is immersed in a sulfur-containing solution (ammonium sulfide) to thereby form a film containing sulfur of several atomic layers on a cavity end surface, and further a protective layer of $Si_3N_4$ or the like is formed on the film, as taught in, for example, the Japanese Patent Laid-Open Publication No. HEI 3-149889.

However, the conventional method of forming the end surface protective layer has the following problems.

That is, if the sulfur atoms adhere to an AlGaAs semiconductor surface, then the interface states are restrained, whereby photoabsorption is inhibited. However, the sulfur layer formed by the solution treatment exhibits weak bond to AlGaAs, and this disadvantageously leads to the detachment of the greater part of the sulfur layer from AlGaAs during the protective layer depositing process.

When forming the protective layer by an electron beam evaporation method on the semiconductor laser device light-emitting end surface that has undergone sulfur treatment, the electron beam impinges on the source of evaporation to heat it up to an elevated temperature to thereby carry out the evaporation. In this stage, the ionized molecules for deposit, part of the electron beam, intense light and so on reach the semiconductor laser device end surface, and these matters act to remove the sulfur layer from the AlGaAs surface.

Furthermore, in case that a compact dielectric protective layer having good adhesion is formed, the electron beam is intensified, and this has caused the problem that the effect of the sulfur treatment is disadvantageously reduced by a large quantity.

When forming a protective layer by a method using plasma, more specifically, an ECR-CVD method, a plasma CVD method, or a sputtering method, instead of the electron beam evaporation method, the plasma impinges on the sulfur layer, removing the sulfur layer from the AlGaAs surface. Therefore, this technique also has the problem that the effect of the sulfur treatment is disadvantageously reduced by a large quantity.

Besides the above method of forming a sulfur layer, a method as a second prior art technique is proposed by, for example, the Japanese Patent Laid-Open Publication No. HEI 7-176819 in which a bar obtained by cleaving a semiconductor laser device wafer is immersed in an ammonium sulfide solution while being irradiated with light, to thereby form a polymolecular layer of sulfur on the semiconductor laser light-emitting end surface.

The polymolecular layer of sulfur formed in this method serves to prevent the sulfur layer from coming off even when ultraviolet rays are applied in the subsequent process.

However, the process of applying light to the bar in the solution has had a problem that, due to difficulties in uniformly dispersing light and the fact that the sulfur polymolecular layer tends to volatilize on an elevated temperature condition (the melting point of monoclinic sulfur is 119° C.) similarly to the aforementioned sulfur layer, the polymolecular layer does not provide sufficient protection for the end surface in depositing a reflecting film at an elevated substrate temperature.

As a third prior art technique, for example, the Japanese Patent Laid-Open Publication No. HEI 4-345079 proposes a method in which after the semiconductor laser device light-emitting end surface has been subjected to an ammonium sulfide solution treatment, a II–VI semiconductor single crystal (such as ZnS) is formed in a high vacuum by an MBE (molecular-beam epitaxy) method.

However, this method requires use of an expensive MBE apparatus. Furthermore, the method using the MBE apparatus has a problem that a technique for crystal growth, which is very hard to control, is needed.

The crystal growth by the MBE method is generally carried out after the formation of an electrode, and this has caused a problem that the satisfactory growth of the II–VI semiconductor single crystal is hard to achieve due to contamination by the electrode or substances adhering to the electrode.

There is a further problem as follows. It is difficult to grow a uniform single crystal II–VI semiconductor on the cleaved surface of AlGaAs, so that unevenness called the hillock frequently occurs. Furthermore, if a single crystal is formed on the semiconductor laser device end surface, there may occur a distortion in the inside of the semiconductor laser device due to differences in coefficient of thermal expansion and lattice constant, eventually causing deterioration of the laser device.

SUMMARY OF THE INVENTION

The present invention has been made to solve the aforementioned problems and has an object to stabilize a surface of a compound semiconductor, such as light-emitting end surfaces of a semiconductor laser device, so that sulfur provided on the surface of the compound semiconductor surface is not detached by the influence of evaporation and the like.

The present invention has another object to increase the lifetime of the semiconductor laser device particularly during a high-power operation.

The above objects are achieved by a compound semiconductor surface stabilizing method comprising steps of:

immersing a region that includes a surface of a compound semiconductor in a solution containing sulfur ions; and immersing the region that includes the surface of the compound semiconductor in a solution containing cations which react with sulfur to form a sulfide.

Note that the "region that includes a surface" of a compound semiconductor may be part of or whole the compound semiconductor.

According to the above arrangement, the sulfur layer is formed by immersing the region that includes a surface of the compound semiconductor in the solution containing sulfur ions, and thereafter the sulfide layer for protecting the sulfur layer is formed by immersing the sulfur layer in the cationic solution that generates a sulfide through reaction with sulfur. The sulfide layer prevents the sulfur layer from being detached from the surface by application of heating, electrons, ions inside plasma, and light or the like. Therefore, the problem of the coming-off, or detachment, of sulfur that has been caused by the prior art technique (as disclosed in, for examples Japanese Patent Laid-Open Publication No. HEI 3-149889) can be solved. Furthermore, the sulfide layer formed in accordance with the invention is superior in stability at high temperatures to the sulfur polymolecular layer formed by the second prior art technique (as disclosed in, for example, Japanese Patent Laid-Open Publication No. HEI 7-176819), and this can prevent the detachment of sulfur even if a high-temperature treatment is performed. Taking advantage of the solution reaction to expose the remaining sulfur ions to the cationic solution, an amorphous or polycrystalline sulfur layer and an amorphous or polycrystalline sulfide layer are formed. Therefore, the sulfide layer can be formed simply and readily, as compared with the third prior art technique (as disclosed in, for example, Japanese Patent Laid-Open Publication No. HEI 4-345079), and yet the formed sulfide gives no strain to the inside of the compound semiconductor, unlike the case of the single crystal. According to the third prior art technique, the sulfur layer that has been once provided through the solution treatment is made to come off, except for only a monomolecular layer, by a heat treatment at a high temperature of 350° C. whereby a II–VI semiconductor single crystal is formed on the remaining monomolecular layer. In contrast to this, according to the present invention, the sulfur layer is prevented from coming off in the sulfide layer forming stage because the sulfide layer is formed without carrying out such a high-temperature treatment.

In one embodiment, between the step of immersing a region that includes a surface of a compound semiconductor in a solution containing sulfur ions and the step of immersing the region that includes the surface of the compound semiconductor in a solution containing cations which react with sulfur to form a sulfide, the method further comprises a step of rinsing the surface of the compound semiconductor.

The method may further include a step of rinsing the surface of the compound semiconductor after the step of immersing the region that includes the surface of the compound semiconductor in a solution containing cations which react with sulfur to form a sulfide.

With such an arrangement, the sulfur layer is formed on the surface by immersing the compound semiconductor in the sulfur solution, and thereafter excessive sulfur is removed by rinsing, or washing in water. Subsequently, the resulting semiconductor is immersed in the cationic solution that causes a sulfide, and the rinsing may further performed as necessary. As a result, a thin uniform sulfide protective layer is formed on the compound semiconductor surface. With this method, nonuniform deposition of sulfide, which might occur in the case where rinsing is not performed, is prevented.

By repeating the above-mentioned four process steps (i.e., the steps of immersing the compound semiconductor in the sulfur solution to form the sulfur layer on its surface, removing the excessive sulfur by performing rinsing, thereafter immersing the resulting semiconductor in the cationic solution that causes a sulfide, and performing rinsing), a uniform thick sulfide protective layer can be formed on the compound semiconductor surface. Thus, the sulfide becomes more operative as the protective layer.

As the solution containing sulfur ions, any of an ammonium sulfide solution (colorless), an ammonium sulfide solution (yellow), a sodium sulfide solution, and a potassium sulfide solution can be used.

The ammonium sulfide solution (colorless), ammonium sulfide solution (yellow) (also called an ammonium polysulfide solution), sodium sulfide solution and potassium sulfide solution have high rates of ionization to sulfur ions. Therefore, if any one of these solutions is used, a sulfur layer can be effectively formed on the surface of the compound semiconductor.

A solution containing cations of any of Zn, Cd and Ca may be used as the solution containing cations.

The solution containing Zn, Cd or Ca, which has a low solubility to water and in which a stable sulfide is formed, is suitable for the solution treatment. Furthermore, because the sulfide formed is a stable compound having a high sublimation temperature or melting point, it is possible to perform a process using a high temperature after the solution treatment. For example, even when a film of alumina or the like is formed at a high temperature on the sulfide, the latter does not come off, which means that a groundwork or liner protecting effect of the sulfide is retained.

If the compound semiconductor contains any of elements of As, P, Al, Ga and In, the solution containing cations is preferably a solution containing at least cations of As, P, Al, Ga or In that is contained in the compound semiconductor.

According to the above arrangement, by using the solution containing the constituent element of As, P, Al, Ga or In of the compound semiconductor as the cationic solution, little influence is exerted on the matrix or base of the compound semiconductor even when elements diffuse from the solution into the compound semiconductor, and vice versa, during a high-temperature treatment. Furthermore, because a stable compound having a high sublimation temperature or melting point is formed, it is possible to incorporate a process using a high temperature after the solution treatment. For example, even when a film of alumina or the like is formed at a high temperature on the sulfide, the latter does not come off, which means that a groundwork protecting effect is continuously retained.

In one embodiment, the solution containing cations is a solution containing both cations and acetate ions.

With this arrangement, taking advantage of the fact that acetic acid is a weak acid, a moderate protective layer formation can be achieved without etching the compound surface.

In one embodiment, the solution containing cations is a zinc acetate solution.

With the zinc acetate solution being used as the cationic solution, a protective zinc sulfide layer, which has a low water-solubility and does not absorb light at the wavelength of emissions from the semiconductor laser device, can be formed through a moderate process that performs no etching of surfaces of the compound.

The solution containing cations may be either a solution containing both cations and chlorine ions or a solution containing both cations and sulfate ions.

In this case, taking advantage of the fact that hydrochloric acid (chlorine ions) and sulfuric acid are strong acids, oxygen and the like is removed from the compound surface. This improves the effect of the sulfur treatment and further allows the formation of the protective layer with sulfide.

In one embodiment, the solution containing cations is a zinc chloride solution or a zinc sulfate solution.

According to the above arrangement, taking advantage of the fact that hydrochloric acid and sulfuric acid are strong acids, the removal of oxygen and the like on the compound surface can be achieved. Also, it is possible to form a zinc sulfide protective layer that has a low water-solubility and does not absorb light at the wavelength of emissions from the semiconductor laser device.

The above object is also achieved by a semiconductor device, according to another aspect of the invention, comprising a compound semiconductor, and an amorphous or polycrystalline sulfur layer and an amorphous or polycrystalline sulfide layer formed in this order on a surface of the compound semiconductor.

In one embodiment, the semiconductor device is a semiconductor laser device, and the surface of the compound semiconductor is an end surface that includes a light-emitting portion.

According to this arrangement, because each of the sulfur layer and the sulfide layer is not monocrystalline, but amorphous or polycrystalline, no distortion is generated inside the semiconductor device. Therefore, the device deterioration attributed to the internal distortion is prevented. Accordingly, the life of the device can be improved.

The sulfide layer may preferably have a thickness of 350 Å or less. With this film thickness, satisfactory device characteristics can be obtained because the device suffers almost no influence of the slope efficiency deterioration which will otherwise take place due to the light absorption and dispersion in the sulfide layer.

The semiconductor laser device with the above construction can be fabricated by sequentially forming a sulfur layer and a sulfide layer on an end surface including a light-emitting portion of the semiconductor laser device by the compound semiconductor surface stabilizing method according to the present invention.

According to the present invention, the region that includes the semiconductor laser light-emitting end surface is sequentially immersed in the solution containing sulfur ions and the solution containing cations that generate a sulfide through reaction with sulfur. As a result, the sulfur layer and the sulfide layer are formed in this order on the end surface. Thus, the sulfur layer, which serves to restrain the device deterioration attributed to the end surface deterioration, is covered with the sulfide layer. Therefore, the sulfur layer keeps stable even in a long-term continuous operation. Accordingly, reliability of the device is improved as compared with the prior art technique of providing only the sulfur layer (for example, Japanese Patent Laid-Open Publication No. HEI 3-149889). Furthermore, the sulfur layer can be covered with a stable sulfide having a sublimation temperature higher than that of the sulfur polymolecular layer that has been formed by the second prior art technique (for example, Japanese Patent Laid-Open Publication No. HEI 7-176819). In addition, unlike the formation of the polymolecular layer by the second prior art technique, formation of the sulfide layer does not require irradiation with light, which allows the semiconductor laser to be fabricated through simpler processes. Dissimilar to the third prior art technique (for example, Japanese Patent Laid-Open Publication No. HEI 4-345079), the sulfide layer can be simply fabricated continuously to the solution treatment for forming the sulfur layer. The sulfide layer formed is not monocrystalline but amorphous or polycrystalline, and therefore, no strain is caused inside the device. Furthermore, according to the third prior art technique, the sulfur layer that has been once provided through the solution treatment is made to come off, except for only a monomolecular layer, by a heat treatment at a high temperature of 350° C. whereby a II–VI semiconductor single crystal is formed on the remaining monomolecular layer. In, contrast to this, according to the present invention, the sulfur layer is prevented from coming off in the sulfide layer forming stage because the sulfide layer is formed without carrying out such a high-temperature treatment.

The semiconductor laser device may be provided with a reflecting film on the sulfide layer. According to this arrangement, the sulfide layer functions as a barrier layer between the sulfur layer and the reflecting film. That is, the sulfide layer serves to prevent the sulfur layer from gradually loosing its effect while diffusing into the reflecting film during a long-time operation and causing the deterioration of the semiconductor laser device. According to the third prior art technique, no reflecting film is provided on the ZnS film.

Formation of the reflecting film on the sulfide layer can by performed by electron beam evaporation, plasma CVD, ECR-CVD, sputtering, or any other method using plasma.

According to the present invention, the impact upon the end surface of the electron beam, ion beam or light applied in the electron beam evaporation stage or of the plasma ions in the plasma methods is remarkably restrained or suppressed by the sulfide layer. This arrangement allows the sulfur layer, which is intended to prevent the device deterioration attributed to the deterioration of the end surface, to be stabilized for a long-time continuous use, which eventually leads to improvement of reliability of the device.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

First Embodiment

The compound semiconductor surface stabilizing method of the first embodiment of the present invention will be described with reference to FIGS. 1 and 2.

Figure 1A:
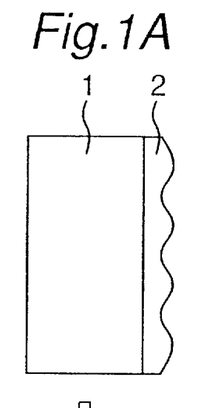
FIGS. 1A, 1B, 1C, 1D, 1E and 1F are schematic cross-sectional views of treated surfaces in various treatment stages according to a prior art and a first embodiment of the present invention.
Figure 1B:
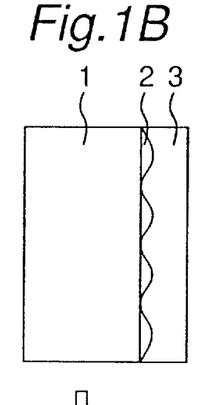
Figure 1C:
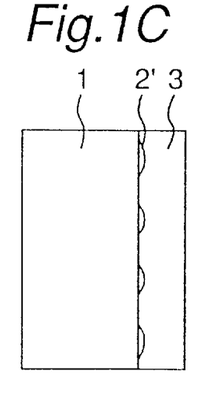
Figure 1D:
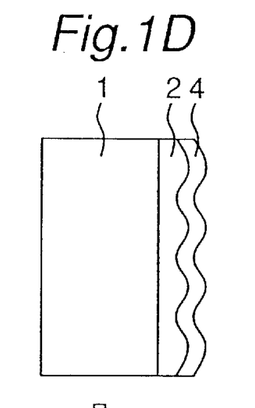
Figure 1E:
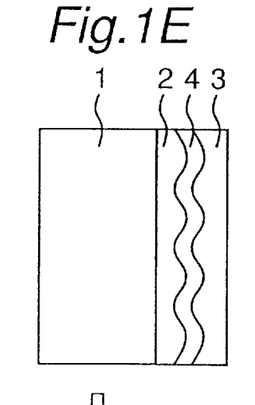
Figure 1F:
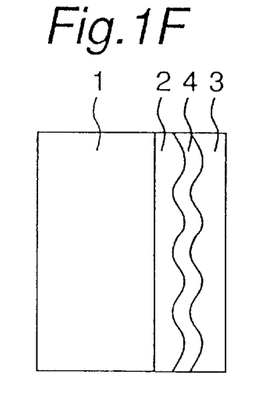

FIGS. 1A through 1C are schematic sectional views of a compound semiconductor having a surface subjected to a sulfur treatment according to a conventional technique, while FIGS. 1D through 1F are schematic sectional views of a compound semiconductor having a surface subjected to a treatment according to the present invention. FIG. 2 is a perspective view of a semiconductor laser device formed by using the present invention.

In the first embodiment, the present invention is applied to coat end surfaces of an AlGaAs semiconductor laser device. Note that in the following, "AlGaAs" represents $Al_xGa_{1-x}As$.

Figure 2:
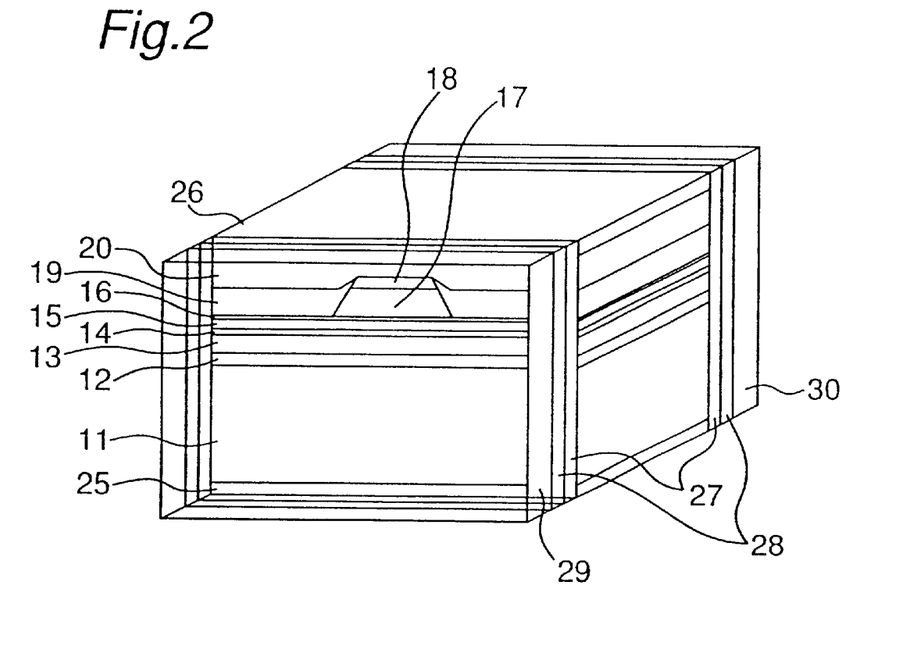
FIG. 2 is a perspective view showing the structure of a semiconductor laser device according to the first embodiment of the present invention.

As shown in FIG. 2, an n-type GaAs buffer layer 12, an n-type AlGaAs (x=0.48) cladding layer 13, an undoped AlGaAs active region 14, a first p-type AlGaAs (x=0.48) cladding layer 15, a p-type GaAs layer 16, a second p-type AlGaAs (x=0.48) cladding layer 17, a p-type GaAs first cap layer 18, an n-type AlGaAs (x=0.7) blocking layer 19 and a p-type GaAs second cap layer 20 are formed on one surface of an n-type GaAs substrate 11. Further, an n-electrode 25 is formed on the opposite surface of the n-type GaAs substrate 11, while a p-electrode 26 is formed on the p-type GaAs second cap layer 20. The undoped AlGaAs active region 14 has a structure in which two AlGaAs (x=0.10) quantum well layers are each interposed between AlGaAs (x=0.34) layers.

A wafer formed with a plurality of semiconductor laser device structures described above is cleaved into bars each of which has a cavity length of 800 μm. Immediately after being cleaved, each bar is immersed in an ammonium sulfide solution (colorless) for 10 seconds, rinsed, or washed in pure water, thereafter immersed in a zinc acetate solution (0.1 mol/l) for 30 seconds, washed in pure water and then dried. Through these processes, a sulfur layer 27 and a sulfide layer 28 constitute a light-emitting end surface.

The bars are put in an electron beam evaporator in an arranged manner and heated to a temperature of 250° C., and thereafter an alumina reflecting film 29 (reflectance: 12%) is formed on the light-emitting end surface (a front surface). Then, a five-layer reflecting film 30 (reflectance: 95%) of alumina/silicon/alumina/silicon/alumina is formed on the other light-emitting end surface (a rear surface).

The bars are each divided into chips and packaged.

For the sake of comparison, a semiconductor laser device was also formed through process steps in which the bar obtained by the wafer cleaving is immersed in an ammonium sulfide solution (colorless) for 10 second, rinsed, dried, and formed with the same reflecting film as that of the present embodiment.

The device characteristics of the first embodiment and the comparative example were measured. The oscillation wavelength of the semiconductor laser devices was 785 nm. As a result of a maximum optical power test in which the optical output power was increased until the destruction of the end surface, the first embodiment exhibited a maximum optical power of 240 mW, and the comparative example, 220 mW, which indicates that there was little difference in maximum optical power between the first embodiment and the comparative example.

However, when these devices were subjected to a continuous operation test carried out with a power of 85 mW at a temperature of 60° C., the comparative example had an average life of about 190 hours, while the first embodiment had a presumed average life of about 2,000 hours, which is about ten times as long as the average life of the comparative example.

The reason for the above is presumed as follows.

After the normal sulfur treatment as in the comparative example, a thin sulfur layer 2 is formed on the surface of a compound semiconductor 1 as shown in FIG. 1A. In forming a reflecting film 3 through electron beam evaporation on the sulfur layer 2, as shown in FIG. 1B, the sulfur layer 2 becomes thinner than that of FIG. 1A due to the impact of electrons, ions and light or the influence of heating during evaporation. Further, during a continuous operation of the semiconductor laser device, the sulfur layer 2 diffuses in the relatively porous reflecting film 3 and becomes further thinned and locally even disappears completely, as shown in FIG. 1C. Consequently, the effect of the sulfur treatment also disappears, causing the deterioration of the semiconductor laser device. To the contrast, if the cationic solution treatment of the present invention is executed subsequent to the sulfur treatment as in the first embodiment, then a sulfide layer 4 covers the sulfur layer 2, as shown in FIG. 1D. This sulfide layer 4 keeps firm adhesion against the impact of light, electrons and ions while the reflecting film 3 is being formed, as shown in FIG. 1E. As a result, the sulfur layer 2 underneath the sulfide layer 4 is kept thick. Further, if the continuous operation test is carried out, since the sulfide layer 4 acts to prevent the diffusion of sulfur from the sulfur layer 2, the sulfur layer is kept thick, as shown in FIG. 1F. It can be considered that the sulfur is stabilized with the above-mentioned mechanism, and accordingly that the average life of the semiconductor laser device is remarkably increased.

The sulfide layer had a thickness of about 50Å.

Although the zinc acetate solution was used in the first embodiment, a cationic solution containing a substance other than zinc may substitute for it. A substance that has low solubility to an aqueous solution and is hard to sublimate or melt until an elevated temperature (for example, 250° C. used in the present first embodiment) is reached, is suitable as a sulfide to be generated through reaction with ammonium sulfide. When used for the light-transmitting surfaces of the light emitting and receiving devices, typically, of the semiconductor laser devices, the sulfide should preferably be transparent with respect to the operation wavelength (for example, 590 nm to 1.5 μm). If the sulfide is colorless, white or yellow, then the material is transparent with respect to the wavelength region ranging from red to infrared light. As an appropriate sulfide in terms of low solubility, there can be enumerated zinc sulfide (white, sublimation temperature: 1180° C., solubility: 0.688 mg/100 ml), cadmium sulfide (yellow., sublimation temperature: 980° C., solubility: 0.13 mg/100 ml) and calcium sulfide (colorless, melting point: 2400° C., hardly soluble to cold water). Arsenic sulfide (yellow, melting point: 300° C.), phosphorus sulfide (yellow, melting point: 290° C.), aluminum sulfide (yellow, sublimation temperature: 1300° C.), gallium sulfide (yellow, melting point: 1255° C.) and indium sulfide (yellow, sublimation temperature: 850° C.) are also appropriate from the viewpoint that each of the substances includes a constituent element of the AlGaAs semiconductor or the AlGaInP semiconductor described later and exerts little influence even when there takes place mutual diffusion of constituent elements between the semiconductor and the sulfide.

Cationic solutions for generating these sulfides should preferably have a high solubility of cations to water. Salts of acetic acid, hydrochloric acid and sulfuric acid with the cations are appropriate since they have relatively high solubility to water. Specifically, there can be enumerated zinc acetate (solubility: 30 g/100 ml), zinc chloride (solubility: 432 g/100 ml), zinc sulfate (solubility: 42 g/100 ml), cadmium acetate (hardly soluble to cold water), cadmium chloride (solubility: 90 g/100 ml), cadmium sulfate (solubility: 76.2 g/100 ml), calcium acetate (solubility: 34.73 g/100 ml), calcium chloride (solubility: 59.5 g/100 ml), calcium sulfate (solubility: 0.298 g/100 ml), arsenic chloride, phosphorus chloride, aluminum acetate, aluminum sulfate (solubility: 36.15 g/100 ml), gallium sulfate, indium chloride and indium sulfate. Among others, the acetate-based salts contain acetic acid that is a weak acid. Therefore, if the acetate-based salts are used for the AlGaAs semiconductor having a high Al mixture ratio (x>0.6), then etch of the surface is little. Therefore, the salts can be widely used.

Second Embodiment

As a second embodiment, a semiconductor laser device was fabricated through process steps in which the bar obtained after the cleaving is immersed in an ammonium sulfide solution (colorless) for ten seconds, and then without being rinsed, immersed in a zinc acetate solution for 30 seconds, then dried, and then formed with a reflecting film which is same as the reflecting film in the first embodiment. There is provided no figure for the second embodiment due to similarity to the first embodiment.

In the second embodiment, a thicker zinc sulfide layer was formed; however, the layer was not uniform in thickness, which ranged from 300 Å A of the thin portion to several thousand angstroms of the thick portion. A greater part of the light-emitting portion of the semiconductor laser device was covered with the sulfide formed to an increased thickness in a grained manner. Such a sulfide is inappropriate for semiconductor laser devices because it hinders the light emission and causes a reduced yield.

However, if it is desired that a thick sulfide layer be formed as a mere protective layer for a non-emission surface, the method of performing no washing in water after the sulfur ion solution treatment or the cationic solution treatment as in the second embodiment is suitable.

According to the first and second embodiments, the zinc acetate solution was used at the normal temperature (about 20° C.). However, the reaction speed can be increased by using a high temperature (60° C., for example), and in which case the sulfide layer can be obtained through a quick immersion. The solubility generally increases at high temperatures, and therefore, a sulfide layer can be formed through quicker immersion in a thicker solution.

Besides the ammonium sulfide solution (colorless), the following can be used as a solution containing sulfur ions: an ammonium sulfide solution (yellow) (also called an "ammonium polysulfide solution"), a sodium sulfide solution, a potassium sulfide solution and the like. The ammonium sulfide solution (yellow) is more capable of deoxidizing and etching the compound semiconductor surface than the ammonium sulfide solution (colorless). The sodium sulfide solution and the potassium sulfide solution have high sulfur ion activating rates and a great ability of deoxidizing the compound semiconductor surface.

Third Embodiment

The compound semiconductor surface stabilizing method of the third embodiment of the present invention will be described with reference to FIG. 3.

Figure 3:
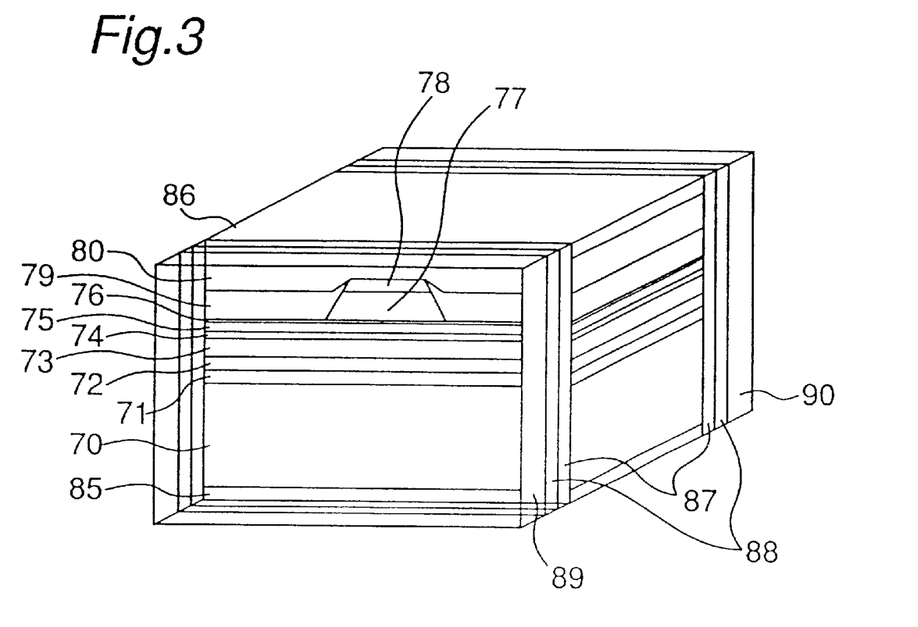
FIG. 3 is a perspective view showing the structure of a semiconductor laser device according to a third embodiment of the present invention.

FIG. 3 is a perspective view showing the structure of a semiconductor laser device fabricated by using the present invention.

It is to be noted that in the third embodiment, the present invention is applied to the light-emitting end surfaces of an AlGaInP semiconductor laser device. The material of $(Al_yGa_{1-y})_{0.5}In_{0.5}P$ is abbreviated to AlGaInP hereinafter.

As shown in FIG. 3, an n-type GaAs buffer layer 71, an n-type GaInP buffer layer 72, an n-type AlGaInP y=0.7) cladding layer 73, an undoped AlGaInP active layer 74, a first p-type AlGaInP (y=0.7) cladding layer 75, a p-type GaInP layer 76, a second p-type AlGaInP (y=0.7) cladding layer 77, a p-type GaInP cap layer 78, an n-type AlInP blocking layer 79, and a p-type GaAs cap layer 80 are formed on a top surface of an n-type GaAs substrate 70. An n-electrode 85 is formed on the opposite surface of the n-type GaAs substrate 70, while a p-electrode 86 is formed on the p-type GaAs cap layer 80. The undoped AlGaInP active layer 74 has a structure in which two GaInP strained quantum well layers are each interposed between AlGaInP (y=0.5) layers.

In the third embodiment, a wafer on which semiconductor laser device structures are formed is cleaved into bars, each of which has a cavity length of 600 μm. Immediately after being cleaved, each bar is immersed in an ammonium sulfide solution (colorless) for 10 seconds, washed in pure water, thereafter immersed in a zinc chloride solution (0.1 mol/l) for 30 seconds, washed in pure water, and then dried. Through these processes, a sulfur layer 87 and a sulfide layer 88 are formed on the light-emitting end surfaces.

Then, the bars are put in a solid-source ECR-CVD apparatus in an arrayed manner, and an alumina reflecting film 89 (reflectance: 8%) is formed on one end surface (a front surface) in an atmosphere containing a mixture of oxygen and argon with the substrate temperature kept at the room temperature. Next, a five-layer reflecting film 90 (reflectance: 95%) of alumina/silicon/alumina/silicon/alumina is formed on the other end surface (a rear surface).

The bars are each divided into chips and packaged.

For the sake of comparison, a semiconductor laser device was prepared without performing the solution treatment of the third embodiment. This comparative semiconductor laser device was formed by immersing the wafer-cleaved bar in an ammonium sulfide solution (colorless) for 10 second, rinsed in water, and then dried. Thereafter, the same reflecting film as that of the third embodiment was formed.

The oscillation wavelengths of the finished semiconductor laser devices were 640 nm. There was a significant difference between the maximum optical power of 90 mW of the third embodiment and the maximum optical power of 65 mW of the comparative example.

These devices were subjected to a continuous operation test which was carried out at a power of 30 mW and a temperature of 60° C. As a result, the comparative example had an average life of about 100 hours, while the third embodiment had a presumed average life of about 2,000 hours, which is about twenty times as long as the average life of the comparative example, indicating a considerable improvement in average life.

Fourth Embodiment

As a fourth embodiment, a bar was prepared by performing the following process. There is provided no figure for this embodiment due to structural similarity to the third embodiment.

In the fourth embodiment, a wafer on which semiconductor laser device structures are formed is cleaved into bars each having a cavity length of 600 μm. Immediately after being cleaved, each bar is immersed in an ammonium sulfide solution (colorless) for 10 seconds, washed in pure water, thereafter immersed in a zinc acetate solution (0.1 mol/l) for 30 seconds, washed in pure water, and then dried. Subsequently, the same treatment as that of the third embodiment will be performed.

The thus formed device of the fourth embodiment was subjected to a continuous operation test, which was carried out at a power of 30 mW and a temperature of 60° C. As a result, the fourth embodiment device treated with zinc acetate had a presumed average life of about 1,000 hours, which is shorter than the presumed average life of about 2,000 hours of the third embodiment device treated with zinc chloride. However, as compared with the comparative example having the average life of about 100 hours, the fourth embodiment device was improved in the average life to be about ten times as long.

The reason for the above can be considered as follows.

There are significant differences in the maximum optical output and the life among the comparative example, the third embodiment, and the fourth embodiment, in spite of the fact that the substrate temperature is not increased in forming the reflecting film by the ECR-CVD method. The substrate temperature is not required to be increased in the ECR-CVD process because methods using plasma, inclusive of the ECR-CVD method, have an effect of cleaning the surface by plasma. However, the aforementioned test results indicate that the sulfur layer is disadvantageously removed by the plasma cleaning if the sulfur treatment is merely performed. Therefore, the device subjected to the mere sulfur treatment virtually becomes equivalent to a device subjected to no sulfur treatment, and the maximum output level of such a device becomes lowered. On the other hand, the test results indicate that if the sulfide layer is additionally formed, this layer serves to protect the sulfur layer against the plasma ions during the ECR-CVD process.

For the AlGaInP semiconductor laser device, the conventional ammonium sulfide treatment does not have a sufficient effect of removing oxygen existing at the interface. Also, it can be considered that the zinc acetate treatment forms a coating merely covering the sulfur layer obtained after the ammonium sulfide treatment and that oxygen is still remaining at the interface. On the other hand, in the case of the zinc chloride treatment, chlorine ions have an etching capability, so that the oxygen at the interface is removed. Therefore, the average life of the device treated with zinc chloride is increased in the continuous operation test, as compared with the device treated with zinc acetate.

It is to be noted that substances containing sulfate ions, such as zinc sulfate, have similar effects as substances containing chlorine ions such as zinc chloride, due to the surface etching capability of the sulfate ions.

Fifth Embodiment

The compound semiconductor surface stabilizing method of the fifth embodiment of the present invention will be described with reference to FIG. 4.

Figure 4:
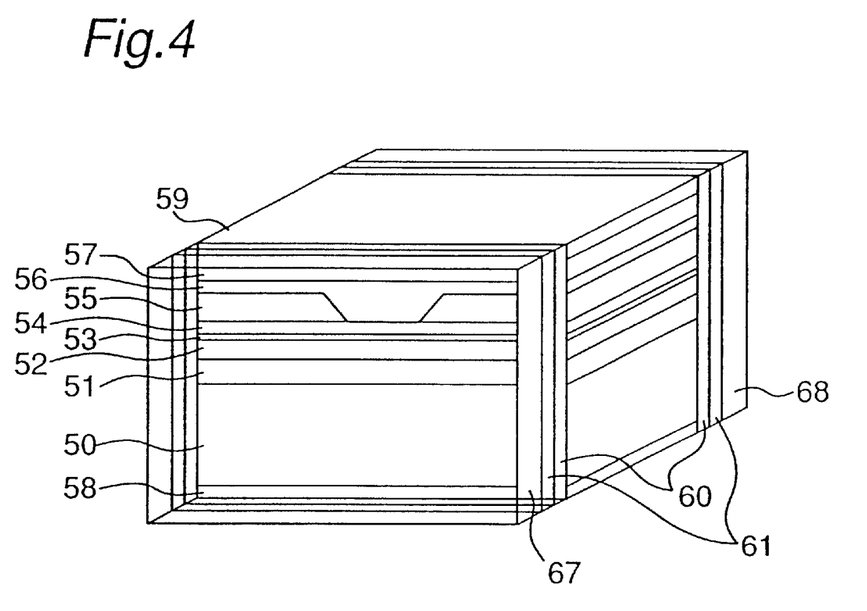
FIG. 4 is a perspective view showing the structure of a semiconductor laser device according to a fifth embodiment of the present invention.

FIG. 4 is a perspective view showing the structure of a semiconductor laser device fabricated by using the present invention.

It is to be noted that in the fifth embodiment, the present invention is applied to the light-emitting end surfaces of a low output power AlGaAs semiconductor laser device.

As shown in FIG. 4, an n-type GaAs buffer layer 51, an n-type AlGaAs cladding layer 52, an undoped AlGaAs active layer 53, a p-type AlGaAs first cladding layer 54, an n-type AlGaP blocking layer 55, a p-type AlGaAs second cladding layer 56, and a p-type GaAs cap layer 57 were formed on a surface of an n-type GaAs substrate 50. An n-electrode 58 was formed on the opposite surface of the n-type GaAs substrate 50, while a p-electrode 59 was formed on the p-type GaAs cap layer 57.

Next, a wafer on which the semiconductor laser device structures were formed was cleaved into bars each having a cavity length of 250 $\mu$m. Immediately after being cleaved, each bar was subjected to the following processes:

A: Immersion in an ammonium sulfide solution (colorless) for 10 seconds, and then washing in pure water; and B: Immersion in a zinc chloride solution (0.1 mol/l) for 10 seconds, and then washing in pure water, the above process steps A and B being repeated 10 times, 20 times, 40 times, and 80 times, for the formation of the correspondingly processed bars. A sulfur layer 60 was formed in the initial process step A, and a zinc sulfide layer 61 was formed through the subsequent alternative immersion processes (B,A,B, . . . ,A,B).

Subsequently, silicon nitride films 67 and 68 were concurrently formed on the front surface and the rear surface of each bar by the plasma CVD method such that the optical film thickness of the silicon nitride film together with the zinc sulfide layer was $\lambda/2$. In this way, semiconductor laser devices with silicon nitride films 67 and 68 were prepared. Silane and ammonia were used as source gases in the plasma CVD process.

Subsequently, the bar was divided into chips and then packaged.

The thicknesses of the sulfide layers obtained by repeating the above processes A and B 10 times, 20 times, 40 times, and 80 times were measured, and were 200 Å, 350 Å, 500 Å, and 600 Å, respectively. By thus increasing the thickness, the end surface protecting capability is increased. However, the slope efficiency (current-to-light efficiency) is reduced due to the increase in the optical absorption and dispersion of the films. Assuming that the slope efficiency obtained in the case of no treatment is 100%, then the slope efficiency was 95% in the case of 200 Å, 90% in the case of 350 Å, 75% in the case of 500 Å, and 65% in the case of 600 Å. The specification of not lower than 90% was satisfied when the film thickness was not greater than 350Å.

The sulfide layers obtained by repeating the above processes A and B 10 times, 20 times, 40 times, and 80 times were subjected to x-ray diffraction, and it was found that the formed ZnS was polycrystalline in each case. Dissimilar to the single crystal, the polycrystalline ZnS does not apply an intense strain due to lattice mismatching to the AlGaAs single crystal that constitutes the semiconductor laser device. This prevents the increase of the strain even through the thickness is increased.

Sixth Embodiment

Figure 5:
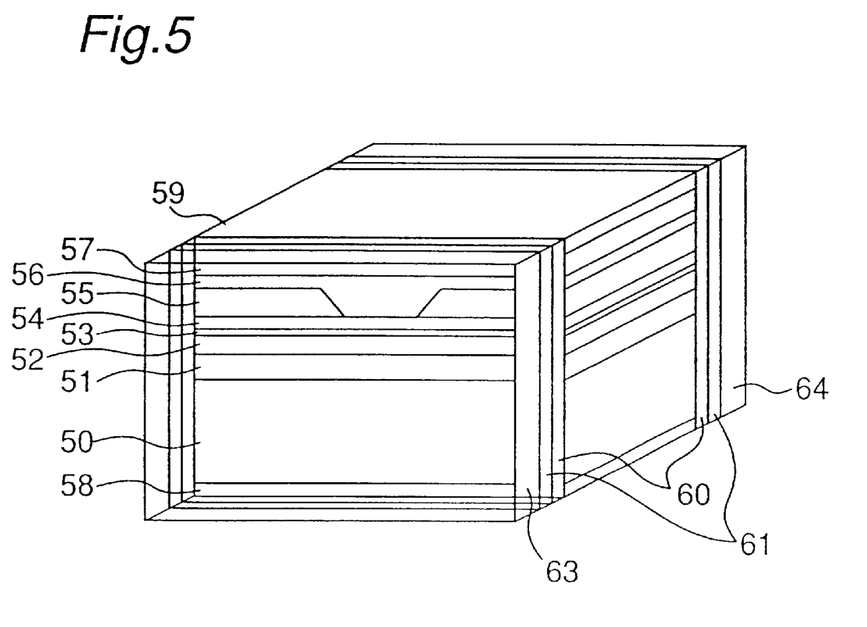
FIG. 5 is a perspective view showing the structure of a semiconductor laser device according to a sixth embodiment of the present invention.

Next, as a sixth embodiment, a semiconductor laser device subjected to the following process was also fabricated. This semiconductor laser device is shown in FIG. 5. In FIG. 5, same films as the films shown in FIG. 4 are denoted by the same reference numerals.

In the sixth embodiment, the solution treatments of the bars as done in the fifth embodiment were repeated 20 times. Then, alumina films 63 and 64 were concurrently formed on the front surface and the rear surface of each bar by sputtering such that the optical film thickness of the alumina film together with the zinc sulfide layer 61 was $\lambda/2$. In this way, semiconductor laser devices with alumina films 63 and 64 were prepared.

Seventh Embodiment

Figure 6:
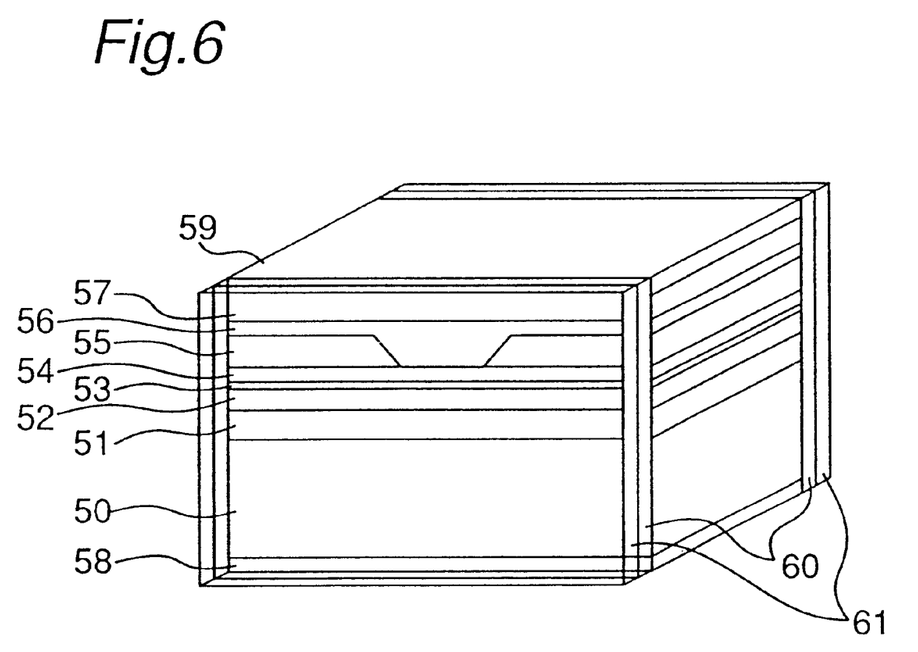
FIG. 6 is a perspective view showing the structure of a semiconductor laser device according to a seventh embodiment of the present invention.

Next, as a seventh embodiment, there was also fabricated a semiconductor laser device subjected to the following processes. This semiconductor laser device is shown in FIG. 6. In FIG. 6, same films as the films shown in FIG. 4 are denoted by the same reference numerals.

In the seventh embodiment, the solution treatments of the bar as done in the fifth embodiment were repeated 20 times. Then, without forming any reflecting films, the bar was heated in a nitrogen atmosphere at a temperature of 250° C. for one hour to stabilize the sulfide layers on the end surfaces of the bar. In this way, a semiconductor laser device with the sulfide layers stabilized was fabricated.

For the sake of comparison, there was fabricated a semiconductor laser device provided with silicon nitride films 67 and 68 of which the optical path length was $\lambda/2$, the films being formed by the plasma CVD method concurrently on the front surface and the rear surface of a cleavage bar having undergone no solution treatments as done in the fifth through seventh embodiments. Silane and ammonium were used as source gases in the plasma CVD process.

The devices of the fifth to seventh embodiments and the comparative device were subjected to a continuous operation test carried out at a power of 7 mW and a temperature of 60° C. As a result, the devices of both the fifth embodiment (in both the cases of 10-time and 20-time repetition of the solution treatments) and the sixth embodiment had a presumed average life of as long as more than 10,000 hours, displaying their superiority in performance. On the other hand, both the seventh embodiment and the comparative example had a presumed average life of more than 5,000 hours, exhibiting a practically sufficient performance.

The continuous operation test proved that in the fifth embodiment and the sixth embodiment, the cation-containing solution treatment followed by the plasma CVD process or the sputtering process to form the semiconductor laser device surface allows the life of the semiconductor laser device to be longer than in the case in which only the plasma CVD process was normally done, without performing the cation-containing solution treatment. This indicates that the surface protection achieved by the present invention is effective for the reflecting film formation not only by the electron beam evaporation method and the ECR-CVD method but also by methods using plasma.

The seventh embodiment is superior to the fifth embodiment, the sixth embodiment and the comparative example in the point that it is not necessary to form the reflecting film, which concurrently serves as a surface protective, on the semiconductor laser device end surfaces so that the device is able to be fabricated safely and simply.

It is to be noted that the treatments or processing of the present invention can be applied to every compound semiconductor for which the interface stabilization through the formation of a sulfur layer is effective. The present invention may be applied not only to the semiconductors of AlGaAs and AlGaInP but also to the compound semiconductors of InGaAsP, InGaAs, GaInNAs and AlGaInN. The present invention can also be applied to the light-emitting surfaces and the chip cut surfaces of LEDs and surface emitting semiconductor laser devices. The present invention can also be used, as necessary, for stabilizing the interface of an FET that employs a compound semiconductor.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A compound semiconductor surface stabilizing method comprising steps of:
   immersing a region that includes a surface of a compound semiconductor in a solution containing sulfur ions; and
   immersing for 30 seconds or less the region that includes the surface of the compound semiconductor in a solution containing cations which react with sulfur to form a sulfide,
   whereby an amorphous or polycrystalline sulfur layer is formed on said surface of the compound semiconductor and an amorphous or polycrystalline sulfide layer is formed on the sulfur layer.

2. A compound semiconductor surface stabilizing method, comprising steps of:
   immersing a region that includes a surface of a compound semiconductor in a solution containing sulfur ions; and
   immersing the region that includes the surface of the compound semiconductor in a solution containing cations which react with sulfur to form a sulfide,
   wherein between said step of immersing a region that includes a surface of a compound semiconductor in a solution containing sulfur ions and said step of immersing the region that includes the surface of the compound semiconductor in a solution containing cations which react with sulfur to form a sulfide, the method further comprises a step of rinsing the surface of the compound semiconductor,
   whereby an amorphous or polycrystalline sulfur layer is formed on said surface of the compound semiconductor and an amorphous or polycrystalline sulfide layer is formed on the sulfur layer.

3. A compound semiconductor surface stabilizing method as claimed in claim 2, wherein after said step of immersing the region that includes the surface of the compound semiconductor in a solution containing cations which react with sulfur to form a sulfide, the method further comprises a step of rinsing the surface of the compound semiconductor.

4. A compound semiconductor surface stabilizing method as claimed in claim 3, wherein said four steps are repeated a plurality of times.

5. A compound semiconductor surface stabilizing method as claimed in claim 1, wherein said solution containing sulfur ions is any of an ammonium sulfide solution (colorless), an ammonium sulfide solution (yellow), a sodium sulfide solution, and a potassium sulfide solution.

6. A compound semiconductor surface stabilizing method as claimed in claim 1, wherein said solution containing cations is a solution containing cations of any of Zn, Cd and Ca.

7. A compound semiconductor surface stabilizing method as claimed in claim 1, wherein, when the compound semiconductor contains any of elements of As, P, Al, Ga and In, said solution containing cations is a solution containing at least cations of As, P, Al, Ga or In that is contained in the compound semiconductor.

8. A compound semiconductor surface stabilizing method as claimed in claim 1, wherein said solution containing cations is a solution containing both cations and acetate ions.

9. A compound semiconductor surface stabilizing method as claimed in claim 8, wherein said solution containing cations is a zinc acetate solution.

10. A compound semiconductor surface stabilizing method as claimed in claim 1, wherein said solution containing cations is either a solution containing both cations and chlorine ions or a solution containing both cations and sulfate ions.

11. A compound semiconductor surface stabilizing method as claimed in claim 10, wherein said solution containing cations is a zinc chloride solution or a zinc sulfate solution.

12. A compound semiconductor surface stabilizing method comprising the steps of:

immersing a region that includes a surface of a compound semiconductor in a solution containing sulfur ions; and immersing the region that includes the surface of the compound semiconductor in a solution containing cations which react with sulfur to form a sulfide, wherein between said step of immersing a region that includes a surface of a compound semiconductor in a solution containing sulfur ions and said step of immersing the region that includes the surface of the compound semiconductor in a solution containing cations which react with sulfur to form a sulfide, the method further comprises a step of rinsing the surface of the compound semiconductor.

13. A compound semiconductor surface stabilizing method as claimed in claim 2, wherein said solution containing cations is a solution containing both cations and acetate ions.

14. A compound semiconductor surface stabilizing method as claimed in claim 2, wherein said solution containing cations is a zinc acetate solution.

15. A compound semiconductor surface stabilizing method as claimed in claim 12, wherein after said step of immersing the region that includes the surface of the compound semiconductor in a solution containing cations which react with sulfur to form a sulfide, the method further comprises a step of rinsing the surface of the compound semiconductor, and said four steps are repeated a plurality of times.

16. A semiconductor laser device fabricating method using a compound semiconductor surface stabilizing method according to any one of claims 1 through 11 to sequentially form a sulfur layer and a sulfide layer on an end surface including a light-emitting portion of a semiconductor laser device.

17. A semiconductor device comprising a compound semiconductor, and an amorphous sulfur layer and an amorphous sulfide layer formed in this order on a surface of the compound semiconductor.

18. A semiconductor device as claimed in claim 17, wherein the semiconductor device is a semiconductor laser device, and the surface of the compound semiconductor is an end surface that includes a light-emitting portion.

19. A semiconductor device as claimed in claim 17, wherein the sulfide layer has a thickness of 350 Å or less.

20. A semiconductor device as claimed in claim 18, further comprising a reflecting film formed on the sulfide layer.

21. A semiconductor laser device fabricating method as claimed in claim 16, wherein a reflecting film is formed on the sulfide layer by electron beam evaporation, plasma CVD, ECR-CVD, sputtering, or any other method using plasma.

* * * * *